(12) United States Patent
Huang et al.

(10) Patent No.: US 11,743,567 B2
(45) Date of Patent: Aug. 29, 2023

(54) MOBILE TERMINAL AND CAMERA ASSEMBLY

(71) Applicant: VIVO MOBILE COMMUNICATION CO., LTD., Chang'an Dongguan (CN)

(72) Inventors: Zhijun Huang, Chang'an Dongguan (CN); Anming Feng, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 16/632,468

(22) PCT Filed: Jul. 19, 2018

(86) PCT No.: PCT/CN2018/096312
§ 371 (c)(1),
(2) Date: Jan. 20, 2020

(87) PCT Pub. No.: WO2019/015651
PCT Pub. Date: Jan. 24, 2019

(65) Prior Publication Data
US 2020/0213491 A1 Jul. 2, 2020

(30) Foreign Application Priority Data
Jul. 21, 2017 (CN) .......................... 201710601219.0

(51) Int. Cl.
H05K 1/02 (2006.01)
H05K 7/20 (2006.01)
(Continued)

(52) U.S. Cl.
CPC .......... *H04N 23/57* (2023.01); *H04M 1/0264* (2013.01); *H05K 1/028* (2013.01);
(Continued)

(58) Field of Classification Search
CPC ....................................................... H05K 5/00
See application file for complete search history.

(56) References Cited

U.S. PATENT DOCUMENTS 7,435,018 B2 * 10/2008 Huang ................... G03B 17/04
348/373
2005/0007679 A1 1/2005 Makii et al.
(Continued)

FOREIGN PATENT DOCUMENTS

CN 1550813 A 12/2004
CN 2717138 Y 8/2005
(Continued)

OTHER PUBLICATIONS

Chinese First Office Action Application No. 201710601219.0; dated Feb. 15, 2019.
(Continued)

*Primary Examiner* — Jerry Wu
(74) *Attorney, Agent, or Firm* — von Briesen & Roper, s.c.

(57) ABSTRACT

A mobile terminal and camera assembly are provided. The mobile terminal includes a housing and the camera assembly; a through hole is arranged in a frame of the housing; the camera assembly includes a camera, support for installing the camera, motor and push-and-pull rod; the motor is fixed to the housing and electrically coupled to a circuit board of the mobile terminal; the motor has a threaded rod, a first end of the push-and-pull rod has a threaded tube fitting with the threaded rod, the threaded tube is sleeved on the threaded rod, and a second end of the push-and-pull rod is coupled to the support; when the motor is actuated, the threaded rod rotates and drives the push-and-pull rod to advance or retreat along the threaded rod, which driving the support to move, (Continued)

thus the camera is extended out of or retracted into the housing through the through hole.

12 Claims, 5 Drawing Sheets

(51) Int. Cl.
  *H04N 23/57* (2023.01)
  *H04M 1/02* (2006.01)
(52) U.S. Cl.
  CPC ....... *H04M 2250/52* (2013.01); *H05K 1/0284* (2013.01); *H05K 7/2089* (2013.01)

(56) References Cited

U.S. PATENT DOCUMENTS

| | | | |
|---|---|---|---|
| 2006/0261257 A1* | 11/2006 | Hwang | H04M 1/0264 250/216 |
| 2007/0253703 A1* | 11/2007 | Tsai | G06F 1/1616 348/E5.025 |
| 2008/0085112 A1 | 4/2008 | Lane et al. | |
| 2010/0230308 A1 | 9/2010 | Liu | |
| 2018/0262663 A1 | 9/2018 | Zhang | |
| 2019/0014201 A1 | 1/2019 | Bao | |
| 2019/0310533 A1 | 10/2019 | Xiao et al. | |

FOREIGN PATENT DOCUMENTS

| | | | |
|---|---|---|---|
| CN | 101523891 A | | 9/2009 |
| CN | 105554200 A | | 5/2016 |
| CN | 103533222 B | | 8/2016 |
| CN | 205545424 U | | 8/2016 |
| CN | 106094990 A | | 11/2016 |
| CN | 106506913 A | | 3/2017 |
| CN | 106790833 A | | 5/2017 |
| CN | 106850896 A | | 6/2017 |
| CN | 106899721 A | | 6/2017 |
| CN | 206251153 U | | 6/2017 |
| CN | 107197133 A | | 9/2017 |
| JP | 2002221650 A | | 8/2002 |
| JP | 2006019853 A | * | 1/2006 |
| WO | WO 2017/075099 A1 | | 5/2017 |

OTHER PUBLICATIONS

European Search Report Application No. 18835219.9; dated May 8, 2020.
International Search Report & Written Opinion relatedto Application No. PCT/CN2018/096312; dated Sep. 27, 2018.
First Indian Office Action for related Application No. 202027007284; dated Jul. 1, 2021.

* cited by examiner

MOBILE TERMINAL AND CAMERA ASSEMBLY

CROSS-REFERENCE TO RELATED APPLICATION

This patent application is a 35 USC § 371 U.S. national stage of International Application No. PCT/CN2018/096312 filed on Jun. 19, 2018, which claims a priority to Chinese Patent Application No. 201710601219.0 filed on Jul. 21, 2017, the disclosure of which is incorporated in its entirety by reference herein.

TECHNICAL FIELD

The present disclosure relates to the field of communication technology, in particular to a mobile terminal and a camera assembly.

BACKGROUND

With the development of a mobile terminal, in order to increase a display size, increasing a display-screen-to-body ratio of a mobile terminal has become the main development trend.

In order to realize a selfie function, the mobile terminal is generally provided with a front camera, and an area in a display screen of the mobile terminal has to be reserved for a camera shooting window, as a result the front camera will occupy a display region of the display screen.

In the related art, a solution to avoid occupying the display area by the front camera is to make a hole on the display screen. In this way, there will be a gap in the front camera position that cannot display normally in a display state, thereby impacting an overall display effect of the display screen negatively. It can be seen that the mobile terminal in the related art has a problem that the front camera occupies the display region.

SUMMARY

A mobile terminal provided by the present disclosure includes a housing and a camera assembly; a through hole is arranged in a frame of the housing; the camera assembly includes a camera, a support for installing the camera, an electric motor and a push-and-pull rod; the electric motor is fixed to the housing and is electrically coupled to a circuit board of the mobile terminal; the electric motor is provided with a threaded rod, a first end of the push-and-pull rod is provided with a threaded tube which fits with the threaded rod, the threaded tube is sleeved on the threaded rod, and a second end of the push-and-pull rod is coupled to the support; when the electric motor is actuated, the threaded rod rotates and drives the push-and-pull rod to advance or retreat along the threaded rod, the push-and-pull rod drives the support to move, such that the camera is extended out of or retracted into the housing through the through hole.

A camera assembly provided by the present disclosure includes a camera, a support for installing the camera, an electric motor and a push-and-pull rod; the electric motor is provided with a threaded rod, a first end of the push-and-pull rod is provided with a threaded tube which fits with the threaded rod, the threaded tube is sleeved on the threaded rod, and a second end of the push-and-pull rod is coupled to the support; when the electric motor is actuated, the threaded rod rotates and drives the push-and-pull rod to advance or retreat along the threaded rod, the push-and-pull rod drives the support to move, such that the camera moves along a straight line.

BRIEF DESCRIPTION OF THE DRAWINGS

In order to more clearly illustrate the technical solutions of the embodiments of the present disclosure, the drawings to be used in the description of the embodiments of the present disclosure will be described briefly below. Obviously, the drawings in the following description merely illustrate some embodiments of the present disclosure. For those skilled in the art, other drawings can also be obtained according to these drawings without creative efforts.

DETAILED DESCRIPTION

The following describes clearly and completely the technical solutions according to the embodiments of the present disclosure with reference to the accompanying drawings in the embodiments of the present disclosure. It is apparent the embodiments in the following description are merely a part rather than all of the embodiments of the present disclosure. All other embodiments obtained by a person of ordinary skill in the art based on the embodiments of the present disclosure without creative efforts shall fall within the scope of the present disclosure.

Figure 1:
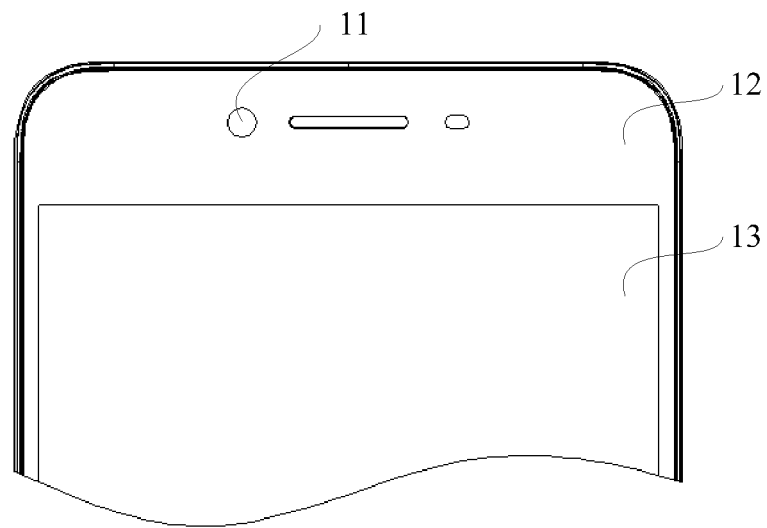
FIG. 1 is a schematic structural diagram of a mobile terminal provided with a front camera in the related art.
Figure 2:
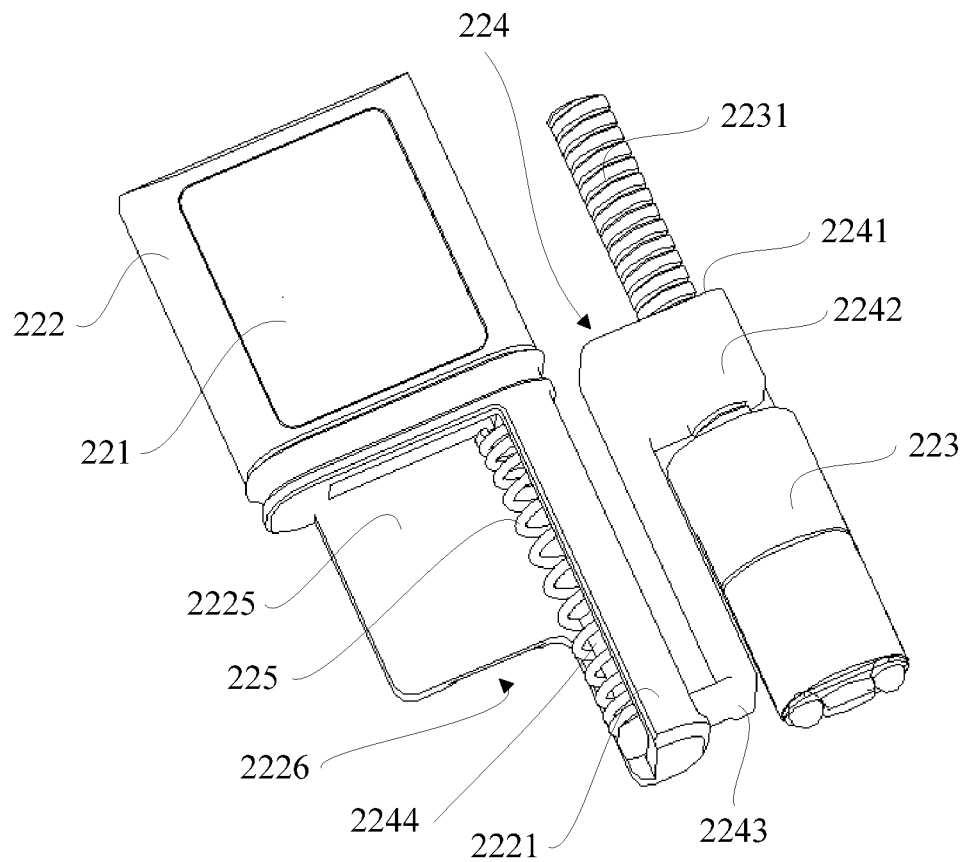
FIG. 2 is a first schematic structural diagram of a camera assembly according to an embodiment of the present disclosure.

As shown in FIG. 1, in the related art, an upper portion of a front face of a mobile terminal needs to be reserved for a camera shooting window 11. In other word, a display screen of the mobile terminal needs to be provided with an upper bezel 12, resulting in a reduced display region 13 of the mobile terminal. Based on the problem, the embodiments of the present disclosure solve the problem that the camera occupies the display region, so as to increase a display-screen-to-body ratio. The embodiments of the present disclosure will be specifically described below with reference to the drawings.

As shown in FIG. 2 to FIG. 5, a mobile terminal provided by an embodiment of the present disclosure includes a housing 21 and a camera assembly 22. A through hole 211 is arranged in a frame of the housing 21; the camera assembly 22 includes a camera 221, a support 222 for installing the camera 221, an electric motor 223 and a push-and-pull rod 224; the electric motor 223 is fixed to the housing 21 and is electrically coupled to a circuit board of the mobile terminal; the electric motor 223 is provided with a threaded rod 2231, a first end 2241 of the push-and-pull rod is provided with a threaded tube 2242 which fits with the threaded rod 2231, the threaded tube 2242 is sleeved on the threaded rod 2231, and a second end 2243 of the push-and-pull rod is coupled to the support.

In the case that the electric motor 223 is actuated, the threaded rod 2231 rotates and drives the push-and-pull rod 224 to advance or retreat along the threaded rod 2231, the push-and-pull rod 224 drives the support 222 to move, such that the camera 221 is extended out of or retracted into the housing 21 through the through hole 211.

Figure 4:
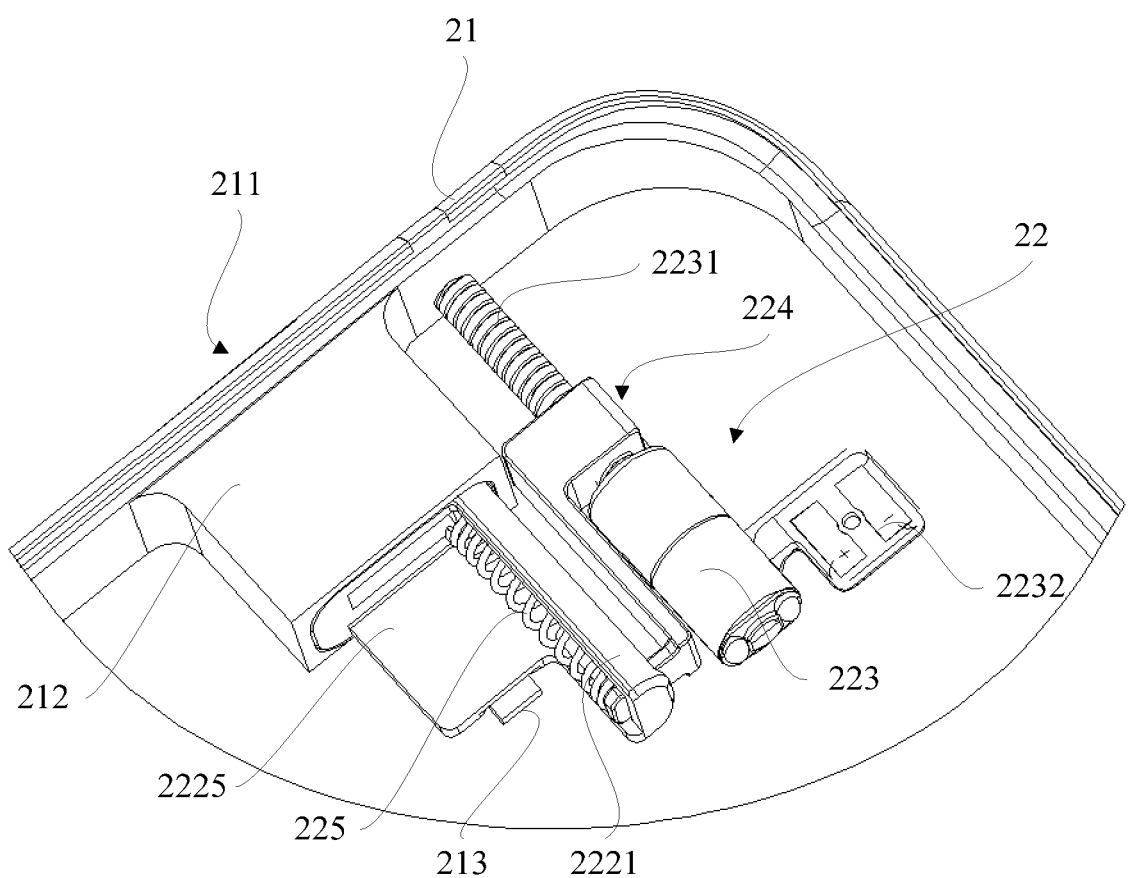
FIG. 4 is a schematic structural diagram illustrating a situation in which a camera is retracted into a housing according to an embodiment of the present disclosure.

As shown in FIG. 4, a state in which the camera 221 is located inside the housing 21 of the mobile terminal, that is, an inactivated state of the camera 221, is illustrated.

Figure 5:
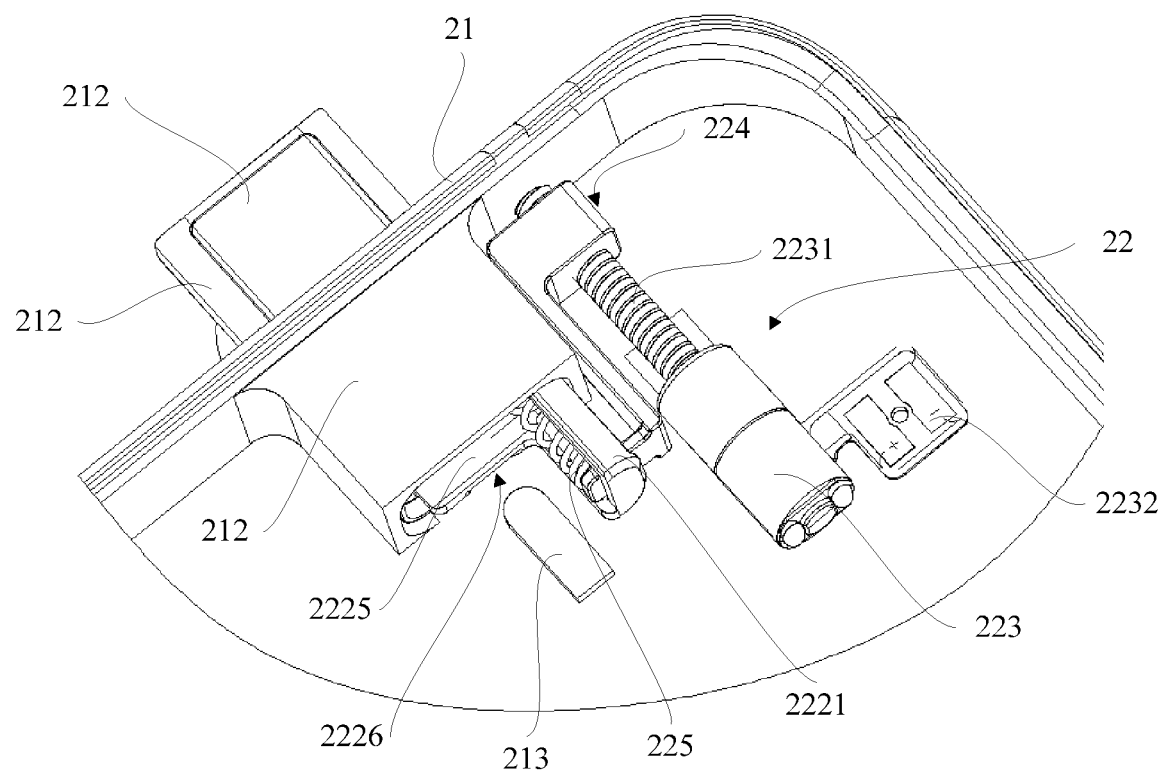
FIG. 5 is a schematic structural diagram illustrating a situation in which a camera is extended out of a housing according to an embodiment of the present disclosure.
Figure 6:
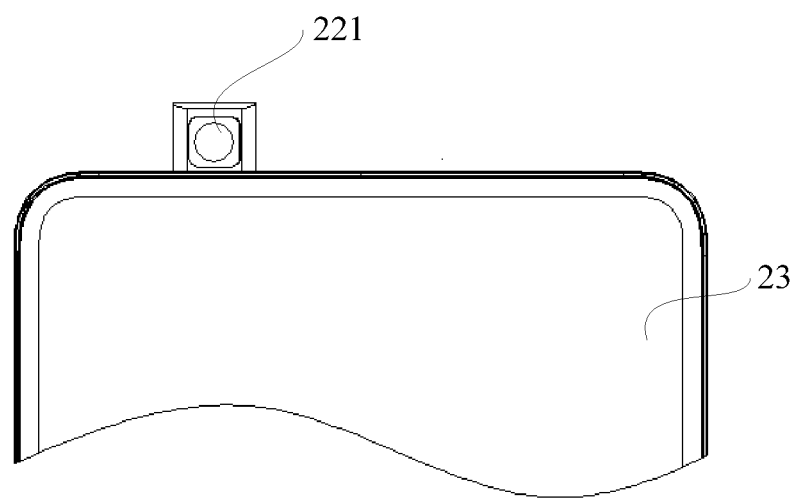
FIG. 6 is a schematic structural diagram of a display region of a mobile terminal according to an embodiment of the present disclosure.

As shown in FIG. 5 and FIG. 6, a state in which the camera 221 is extended out of the housing 21 of the mobile terminal, that is, an activated state of the camera 221, is illustrated.

Figure 3:
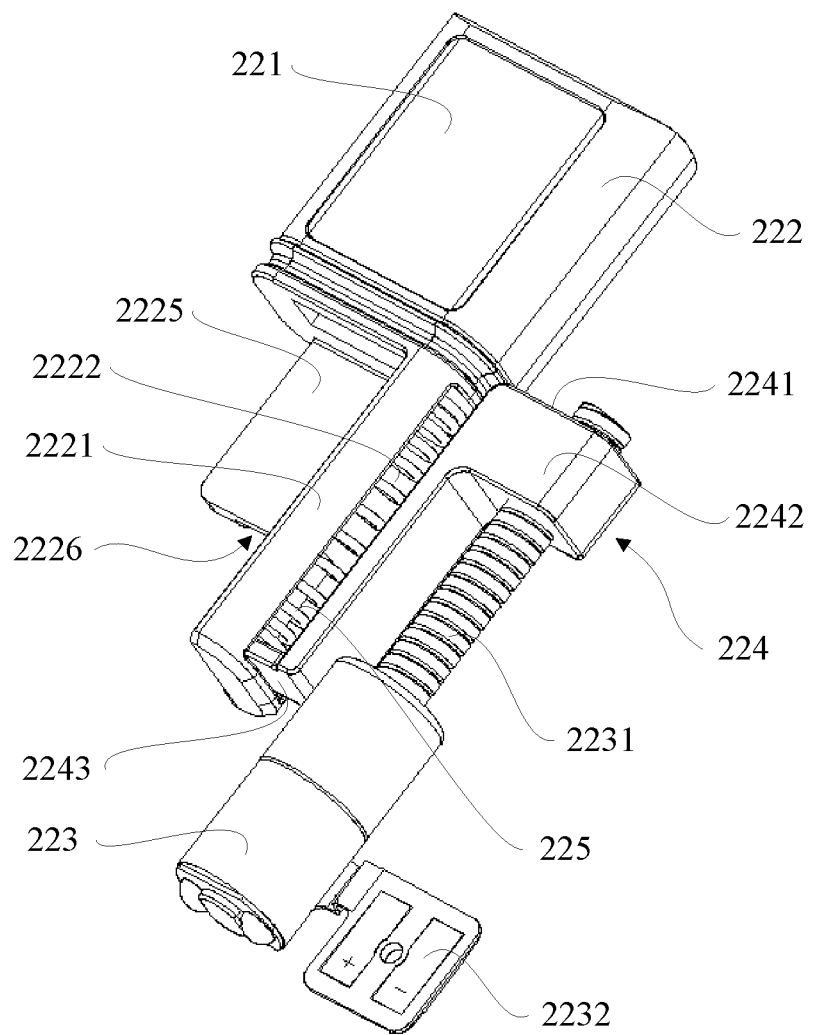
FIG. 3 is a second schematic structural diagram of the camera assembly according to the embodiment of the present disclosure.

As for the provision of a driving power supply of the electric motor 223, a driving power supply 2232 may be provided separately for the electric motor 223, as shown in FIG. 3, or a battery of the mobile terminal may serve as the driving power supply of the electric motor 223, which is not limited to the embodiments of the present disclosure.

The electric motor 223, as a driving component for driving the camera 221 to move, needs to be electrically coupled to the circuit board of the mobile terminal, that is, the electric motor 223 should be controlled by a processor of the mobile terminal. Specifically, an actuating button, an actuating key or an actuating switch for actuating the electric motor 223 may be provided on the mobile terminal, or the electric motor 223 may be actuated by means of voice or gesture, etc.

When the mobile terminal is used to take a photograph, the electric motor 223 is actuated, the electric motor 223 rotates the threaded rod 2231, the threaded rod 2231 drives the push-and-pull rod 224 to advance along the threaded rod 2231, and the push-and-pull rod 224 pushes the support 222 to move outwards, so that the camera 221 is extended out of the housing 21.

When the photo taking is done, the electric motor 223 is actuated, the electric motor 223 rotates the threaded rod 2231 in an opposite direction, the threaded rod 2231 drives the push-and-pull rod 224 to retreat along the threaded rod 2231, and the push-and-pull rod 224 pulls the support 222 to move inwards, so that the camera 221 is retracted into the housing 21 to hide the camera 221.

In an embodiment of the present disclosure, the camera 221 may be a front camera, a rear camera or a rotary-type camera.

In an embodiment of the present disclosure, the mobile terminal includes, but is not limited to, electronic devices such as a mobile phone, a tablet computer, a notebook computer, a palmtop computer, a video camera, a navigation device, a wearable device, a smart bracelet and a pedometer.

As shown in FIG. 6, in the case that the camera 221 is a front camera, the camera 221 may enter and exit via the frame of the housing of the mobile terminal without occupying the display region 23 of the mobile terminal, and the display region 23 of the mobile terminal may cover almost the entire display screen.

It can be seen that, according to embodiments of the present disclosure, the display-screen-to-body ratio of the mobile terminal may be increased, thereby effectively solving a contradiction between increasing the display-screen-to-body ratio and occupying the display region by the front camera. According to embodiments of the present disclosure, the mobile terminal provides a photographing function, maximizes the display-screen-to-body ratio, and ensures an integrity of the display region.

Optionally, as shown in FIG. 2 to FIG. 5, the camera assembly 22 further includes an elastic component 225. One end of the elastic component 225 is coupled to the support 222, the other end of the elastic component 225 is coupled to the second end 2243 of the push-and-pull rod.

When photographing, the camera 221 is extended out of the housing 21 of the mobile terminal. If the mobile terminal falls at this time, it will cause an impact on the camera 221. If the support 222 and the push-and-pull rod 224 are in a rigid connection, the impact force will be directly transmitted to the push-and-pull rod, which may cause a deformation of the threaded rod 2231 and cause the electric motor 223 to fail.

To solve this problem, the connection between the push-and-pull rod 224 and the support 222 may be a movable connection. Specifically, an elastic component 225 may be arranged between the support 222 and the push-and-pull rod 224 for cushioning, and the elastic component 225 may be a spring. When the camera 221 is impacted by an external force, the elastic component 225 may absorb the impact force and prevent the push-and-pull rod 224 from subjecting to a force directly, thereby effectively solving the problem that the electric motor 223 fails due to the falling of the mobile terminal.

Optionally, as shown in FIG. 2 to FIG. 5, the support 222 is provided with an accommodating tube 2221; a side wall of the accommodating tube 2221 is provided with a through slot 2222 along an axial direction of the accommodating tube 2221; the through slot 2222 is provided facing the push-and-pull rod 224. The elastic component 225 is received in the accommodating tube 2221. The second end 2243 of the push-and-pull rod is disposed between the other end of the elastic component 225 and an end wall of the accommodating tube 2221 and abuts against the end wall of the accommodating tube 2221.

In an embodiment of the present disclosure, the elastic component 225 is arranged inside the accommodating tube 2221, and the accommodating tube 2221 can limit the elastic component 225, thereby preventing the elastic component 225 from being bent and deformed under force, and improving stability of the elastic component 225.

Optionally, as shown in FIG. 2 to FIG. 5, the elastic component 225 is a spring. A protruding portion 2244 is arranged at the second end 2243 of the push-and-pull rod, and the protruding portion 2244 is stuck in a cavity at an end of the spring.

The protruding portion 2244 arranged at the second end 2243 of the push-and-pull rod is beneficial to increasing an engagement tightness between the second end 2243 of the push-and-pull rod and the spring. Due to the restriction of the protruding portion 2244, the spring is not easily displaced, and is not prone to disengage from the second end 2243 of the push-and-pull rod.

Optionally, as shown in FIG. 4 to FIG. 5, the housing 21 is further provided with a guide box 212 connected to the through hole 211. When the electric motor 223 is actuated, the support 222 slides along the guide box 212 to force the camera 221 to be extended out of or retracted into the guide box 212.

In order to make the camera 221's extension out of or retraction into the housing 21 through the through hole 211 more smooth, the guide box 212 may be arranged on the housing 21 so that the camera 221 may slide along the guide box 212.

Figure 7:
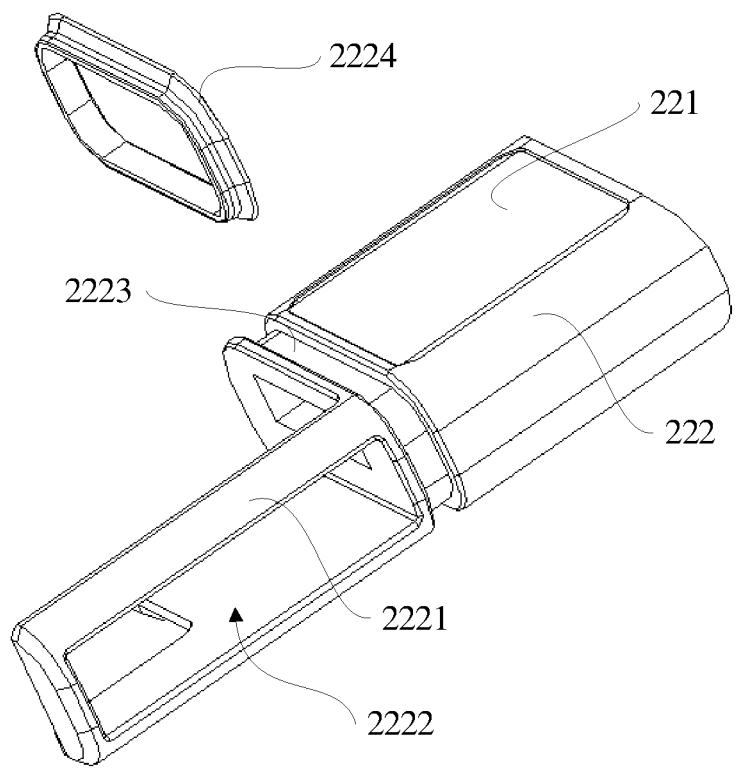
FIG. 7 is a schematic structural diagram of a camera assembly with a seal ring according to an embodiment of the present disclosure.
Figure 8:
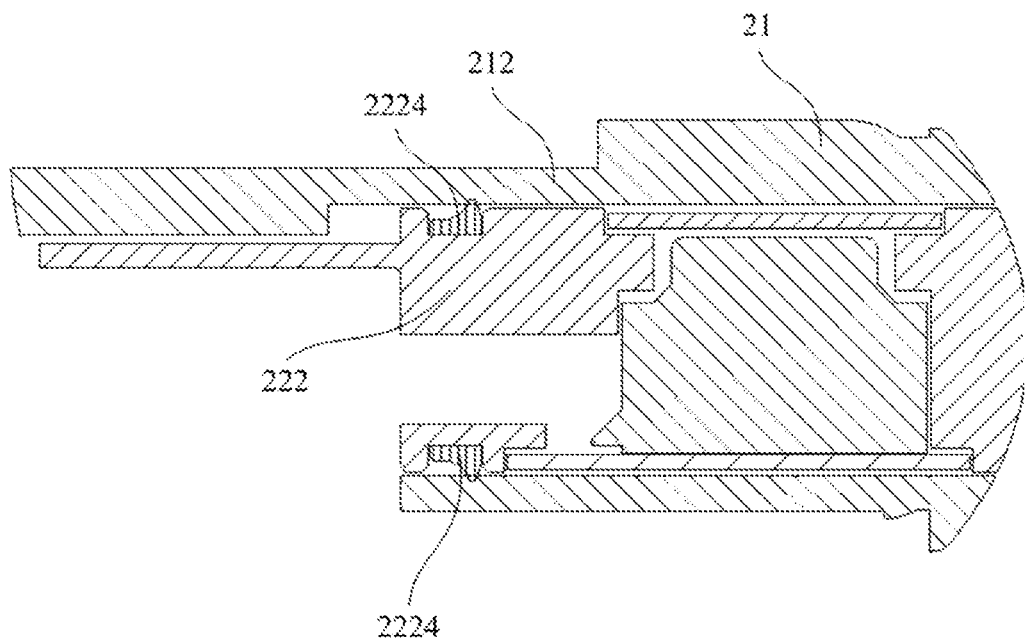
FIG. 8 is a cross-sectional view of a camera assembly with a seal ring according to an embodiment of the present disclosure.

Optionally, as shown in FIG. 7 to FIG. 8, the support 222 is further provided with an annular groove 2223. A seal ring 2224 is embedded in the annular groove 2223 and the seal ring 2224 is in a sealing engagement with an inner wall of the guide box 212.

Since the camera 221 needs to move outside the housing 21, the through hole 211 has to be opened in the frame of the housing 21. Thus, there is a risk that liquid and dust may enter the through hole 211. In order to solve this problem, in an embodiment of the present disclosure, the annular groove 2223 is arranged on the support 222, and the seal ring 2224 is embedded in the annular groove 2223 to achieve the effects of liquid proof and dust proof.

Optionally, as shown in FIG. 7 to FIG. 8, the annular groove 2223 is arranged between the camera 221 and the accommodating tube 2221. When the camera 221 slides along the guide box 212, the seal ring 2224 does not disengage from the guide box 212.

With the above arrangement, the seal ring 2224 always moves in the guide box 212 of the housing 21 during a movement process of the camera 221. Regardless of how the camera 221 moves, a seal is maintained, thereby achieving the liquid proof and dust proof all the time.

Optionally, as shown in FIG. 4 to FIG. 5, the housing is provided with a guide block 213, the support 222 is further provided with a guide plate 2225, a guide groove 2226 is opened on the guide plate 2225, and the guide block 213 is inserted in the guide groove 2226.

With the above arrangement, when the camera 221 is extended out of or retracted into the housing 21 through the through hole 211, the camera 221 is guided by the guide block 213, and cannot deviate from a sliding path during sliding, so that the movement of the camera 221 is more smooth and stable.

In addition, as shown in FIG. 2 to FIG. 8, a camera assembly 22 provided by an embodiment of the present disclosure includes the camera 221, the support 222 for installing the camera 221, the electric motor 223 and the push-and-pull rod 224; the electric motor 223 is provided with the threaded rod 2231, the first end 2241 of the push-and-pull rod is provided with the threaded tube 2242 which fits with the threaded rod 2231; the threaded tube 2242 is sleeved on the threaded rod 2231; and the second end 2243 of the push-and-pull rod is coupled to the support 222; when the electric motor 223 is actuated, the threaded rod 2231 rotates and drives the push-and-pull rod 224 to advance or retreat along the threaded rod 2231; the push-and-pull rod 224 drives the support 222 to move, such that the camera 221 moves along a straight line.

Optionally, the camera assembly 22 further includes the elastic component 225; one end of the elastic component 225 is coupled to the support 222; the other end of the elastic component 225 is coupled to the second end of the push-and-pull rod 224.

Optionally, the support 222 is provided with the accommodating tube 2221; the side wall of the accommodating tube 2221 is provided with the through slot 2222 along the axial direction of the accommodating tube 2221; the through slot 2222 is provided facing the push-and-pull rod 224; the elastic component 225 is received in the accommodating tube 2221; the second end 2243 of the push-and-pull rod is disposed between the other end of the elastic component 225 and the end wall of the accommodating tube 2221 and abuts against the end wall of the accommodating tube 2221.

Optionally, the elastic component 225 is a spring, the protruding portion 2244 is provided at the second end 2243 of the push-and-pull rod, and the protruding portion 2244 is stuck in the cavity at the end of the spring.

Optionally, the support 222 is further provided with the annular groove 2223, the seal ring 2224 is embedded in the annular groove 2223.

According to embodiments of the present disclosure, the display-screen-to-body ratio of the mobile terminal may be increased, thereby effectively solving the contradiction between increasing the display-screen-to-body ratio and occupying the display region by the front camera. In embodiments of the present disclosure, the mobile terminal provides the photographing function, maximizes the display-screen-to-body ratio, and ensures an integrity of the display region.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A mobile terminal, comprising a housing and a camera assembly, wherein
   a through hole is arranged in a frame of the housing;
   the camera assembly comprises a camera, a support for installing the camera, an electric motor and a push-and-pull rod;
   the electric motor is fixed to the housing and is electrically coupled to a circuit board of the mobile terminal;
   the electric motor is provided with a threaded rod, a first end of the push-and-pull rod is provided with a threaded tube which fits with the threaded rod, the threaded tube is sleeved on the threaded rod, and a second end of the push-and-pull rod is coupled non-rigidly to the support via an elastic component received in an accommodating tube, wherein an end of the elastic component is coupled to the support, and an other end of the elastic component is coupled to the second end of the push-and-pull rod;
   when the electric motor is actuated, the threaded rod rotates and drives the push-and-pull rod to advance or retreat along the threaded rod, the second end of the push-and-pull rod drives the support to move via the elastic component, such that the camera is extended out of or retracted into the housing through the through hole.

2. The mobile terminal according to claim 1, wherein a side wall of the accommodating tube is provided with a through slot along an axial direction of the accommodating tube and facing the push-and-pull rod; the second end of the push-and-pull rod is disposed between the other end of the elastic component and an end wall of the accommodating tube and abuts against the end wall of the accommodating tube.

3. The mobile terminal according to claim 2, wherein the elastic component is a spring, a protruding portion is arranged at the second end of the push-and-pull rod, and the protruding portion is stuck in a cavity at an end of the spring.

4. The mobile terminal according to claim 1, wherein the housing is further provided with a guide box connected to the through hole, when the electric motor is actuated, the support slides along the guide box to extend the camera out of the guide box or retract the camera into the guide box.

5. The mobile terminal according to claim 4, wherein the support is further provided with an annular groove, a seal ring is embedded in the annular groove, the seal ring is in a sealing engagement with an inner wall of the guide box.

6. The mobile terminal according to claim 1, wherein the housing is provided with a guide block, the support is further provided with a guide plate, a guide groove is opened on the guide plate, the guide block is inserted in the guide groove.

7. The mobile terminal according to claim 1, wherein the housing is further provided with a guide box connected to the through hole, when the electric motor is actuated, the support slides along the guide box to extend the camera out of the guide box or retract the camera into the guide box.

8. The mobile terminal according to claim 2, wherein the housing is further provided with a guide box connected to the through hole, when the electric motor is actuated, the support slides along the guide box to extend the camera out of the guide box or retract the camera into the guide box.

9. The mobile terminal according to claim 3, wherein the housing is further provided with a guide box connected to the through hole, when the electric motor is actuated, the support slides along the guide box to extend the camera out of the guide box or retract the camera into the guide box.

10. The mobile terminal according to claim 1, wherein the housing is provided with a guide block, the support is further provided with a guide plate, a guide groove is opened on the guide plate, the guide block is inserted in the guide groove.

11. The mobile terminal according to claim 2, wherein the housing is provided with a guide block, the support is further provided with a guide plate, a guide groove is opened on the guide plate, the guide block is inserted in the guide groove.

12. The mobile terminal according to claim 3, wherein the housing is provided with a guide block, the support is further provided with a guide plate, a guide groove is opened on the guide plate, the guide block is inserted in the guide groove.

* * * * *